United States Patent
Cao et al.

(10) Patent No.: US 12,333,221 B2
(45) Date of Patent: Jun. 17, 2025

(54) NONLINEAR SYSTEM MODELING METHOD FOR MOTOR AND MODELING DEVICE

(71) Applicant: AAC Acousitc Technologies (Shanghai) Co., Ltd., Shanghai (CN)

(72) Inventors: Zhongqing Cao, Shenzhen (CN); Zheng Xiang, Shenzhen (CN); Xuan Guo, Shenzhen (CN)

(73) Assignee: AAC Acoustic Technologies (Shanghai) Co., Ltd., Shanghai (CN)

(*) Notice: Subject to any disclaimer, the term of this patent is extended or adjusted under 35 U.S.C. 154(b) by 841 days.

(21) Appl. No.: 17/566,639

(22) Filed: Dec. 30, 2021

(65) Prior Publication Data
US 2022/0366099 A1    Nov. 17, 2022

(30) Foreign Application Priority Data
May 10, 2021 (CN) .......................... 202110504865.1

(51) Int. Cl.
 *G06F 30/20* (2020.01)
 *H02P 29/00* (2016.01)

(52) U.S. Cl.
 CPC .............. *G06F 30/20* (2020.01); *H02P 29/00* (2013.01)

(58) Field of Classification Search
 CPC .......... G06F 30/20; G06F 30/15; G06F 30/17; G06F 17/14; G06F 17/15; H02P 29/00; H02P 6/34
 See application file for complete search history.

(56) References Cited

U.S. PATENT DOCUMENTS

2008/0262806 A1* 10/2008 Vau ...................... G05B 13/042
                                                         703/2

OTHER PUBLICATIONS

Chen HC, Cao ZQ, Chen CY, Wang B, Gong CY, Zhang ZX, Cai ZB. Design and construction of a novel instrument for high-frequency micro-force electrical sliding friction testing. Review of Scientific Instruments. Sep. 1, 2019;90(9). (Year: 2019).*

* cited by examiner

*Primary Examiner* — Chuen-Meei Gan
(74) *Attorney, Agent, or Firm* — Wiersch Law Group

(57) ABSTRACT

The invention provides a motor nonlinear system modeling method including steps of: obtaining a chirp signal of a first frequency band, and a chirp signal of a second frequency band; exciting the motor by using the chirp signal; obtaining a higher harmonic frequency response of the first frequency band; exciting the motor by using the chirp signal of the second frequency band; obtaining a higher harmonic frequency response of the second frequency band; obtaining a higher harmonic frequency response by splicing the higher harmonic frequency response of the first frequency band and the higher harmonic frequency response of the second frequency band in the frequency domain. The higher harmonic frequency response of the working frequency of the motor is a nonlinear system model of the motor. By virtue of the method provided by the present invention, the accuracy of motor modeling is effectively improved.

7 Claims, 10 Drawing Sheets

101: obtaining a chirp signal of a first frequency band in a working frequency of the motor, and a chirp signal of a second frequency band in the working frequency of the motor; wherein a start frequency of the first frequency band is a start frequency of the working frequency of the motor, a cut-off frequency of the second frequency band is a cut-off frequency of the working frequency of the motor, and the first frequency band partially overlaps the second frequency band 102: exciting the motor by using the chirp signal of the first frequency band to obtaining a first output, and according to the chirp signal of the first output and the first frequency band, obtaining the higher harmonic frequency response of the first frequency band 103: obtaining a higher harmonic frequency response of the first frequency band according to the first output and the chirp signal of the first frequency band, and according to the chirp signal of the second output and the second frequency band, obtaining the higher harmonic frequency response of the second frequency band 104: obtaining a higher harmonic frequency response of the working frequency of the motor by splicing the higher harmonic frequency response of the first frequency band and the higher harmonic frequency response of the second frequency band in the frequency domain; the higher harmonic frequency response of the working frequency of the motor is a nonlinear system model of the motor

Fig. 1

```
                                                    ┌─ 301
┌──────────────────────────────────────────────────┴──┐
│ obtaining chirp signals of multiple different frequency bands in a │
│ working frequency of the motor; wherein, among the multiple different │
│ frequency bands, a start frequency of one frequency band is a start │
│ frequency of the working frequency of the motor; a cut-off frequency │
│ of a frequency band that is a cut-off frequency of the working │
│ frequency of the motor, and the multiple different frequency bands │
│ form the working frequency of the motor │
└──────────────────────────────────────────────────┘
                          │
                          ▼                        ┌─ 302
┌──────────────────────────────────────────────────┴──┐
│ exciting the motor by the chirp signal of each frequency band, and │
│ obtaining an output corresponding to each frequency band │
└──────────────────────────────────────────────────┘
                          │
                          ▼                        ┌─ 303
┌──────────────────────────────────────────────────┴──┐
│ obtaining a higher harmonic frequency response of each frequency │
│ bandaccording to the output corresponding to each frequency band and │
│ the chirp signal of each frequency band to obtain higher harmonic │
│ frequency responses of multiple frequency bands │
└──────────────────────────────────────────────────┘
                          │
                          ▼                        ┌─ 304
┌──────────────────────────────────────────────────┴──┐
│ Splicing the higher harmonic frequency responses of multiple frequency bands │
│ in the frequency domain to obtain the higher harmonic frequency response of │
│ the working frequency of the motor, and the higher harmonic frequency │
│ response of the working frequency of the motor is the nonlinear system model │
│ of the motor │
└──────────────────────────────────────────────────┘
```

Fig. 7

NONLINEAR SYSTEM MODELING METHOD FOR MOTOR AND MODELING DEVICE

FIELD OF THE PRESENT DISCLOSURE

The present invention relates to the technical field of tactile perception, and in particular to a nonlinear system modeling method for a motor.

DESCRIPTION OF RELATED ART

As a tactile feedback device with better user experience, linear motors are increasingly being widely used in electronic equipment such as mobile phones. In order to achieve more precise control of the linear motor system, it is necessary to improve the accuracy of motor modeling.

However, when the chirp signal system in the related technology is used to identify the working frequency excitation signal of the motor for modeling, the accuracy of the nonlinear system model of the motor obtained is low.

SUMMARY OF THE PRESENT INVENTION

One of the main objects of the present invention is to provide nonlinear system modeling method for a motor with improved accuracy.

To achieve the above-mentioned objects, the present invention provides a nonlinear system modeling method for a motor, including steps of:
  obtaining a chirp signal of a first frequency band in a working frequency of the motor, and a chirp signal of a second frequency band in the working frequency of the motor; wherein a start frequency of the first frequency band is a start frequency of the working frequency of the motor, a cut-off frequency of the second frequency band is a cut-off frequency of the working frequency of the motor, and the first frequency band partially overlaps the second frequency band;
  exciting the motor by using the chirp signal of the first frequency band to obtaining a first output;
  obtaining a higher harmonic frequency response of the first frequency band according to the first output and the chirp signal of the first frequency band;
  exciting the motor by using the chirp signal of the second frequency band to obtain a second output;
  obtaining a higher harmonic frequency response of the second frequency band according to the second output and the chirp signal of the second frequency band;
  obtaining a higher harmonic frequency response of the working frequency of the motor by splicing the higher harmonic frequency response of the first frequency band and the higher harmonic frequency response of the second frequency band in the frequency domain;
  the higher harmonic frequency response of the working frequency of the motor is a nonlinear system model of the motor.

In addition, the nonlinear system modeling method for a motor further includes steps of:
  obtaining a first preset frequency and a second preset frequency greater than the first preset frequency;
  determining a frequency band of the working frequency of the motor that is less than or equal to the second preset frequency as the first frequency band;
  determining a frequency band of the working frequency of the motor that is greater than or equal to the first preset frequency as the second frequency band; wherein the step of obtaining the higher harmonic frequency response of the working frequency of the motor by splicing the higher harmonic frequency response of the first frequency band and the higher harmonic frequency response of the second frequency band in the frequency domain, includes steps of:
  obtaining a third preset frequency between the first preset frequency and the second preset frequency.
  truncating a higher harmonic frequency response of the third frequency band from the higher harmonic frequency response of the first frequency band; wherein a start frequency of the third frequency band is the start frequency of the first frequency band; a cut-off frequency of the third frequency band is the third preset frequency;
  truncating a higher harmonic frequency response of a fourth frequency band from the higher harmonic frequency response of the second frequency band; wherein a start frequency of the fourth frequency band is the third preset frequency; a cut-off frequency of the fourth frequency band is the cut-off frequency of the second frequency band;
  obtaining a higher harmonic frequency response of the working frequency of the motor by splicing the higher harmonic frequency response of the third frequency band and the higher harmonic frequency response of the fourth frequency band in the frequency domain.

In addition, the nonlinear system modeling method for a motor further includes steps of:
  obtain a fourth preset frequency;
  determining a frequency band of the working frequency of the motor that is less than or equal to the fourth preset frequency as the first frequency band;
  determining a frequency band greater than or equal to the fourth preset frequency in the working frequency of the motor as the second frequency band.

In addition, the step of obtaining the higher harmonic frequency response of the first frequency band in the first output and the chirp signal of the first frequency band includes steps of:
  using Fourier transform on the first output to obtain the first frequency domain response;
  according to the first frequency domain response, using an inverse signal frequency domain of the chirp signal of the first frequency band to analyze and calculate the first response function of the motor system;
  using the first response function to obtain a first kernel function through conversion matrix conversion;
  obtaining the higher harmonic frequency response of the first frequency band from the chirp signal of the first frequency band and the first kernel function; wherein
the step of obtaining the higher harmonic frequency response of the second frequency band according to the second output and the chirp signal of the second frequency band includes steps of:
  using Fourier transform on the second output to obtain the second frequency domain response;
  according to the second frequency domain response, using an inverse signal frequency domain of the chirp signal of the second frequency band to analyze and calculate the second response function of the motor system;
  using a second response function to obtain the second kernel function through conversion matrix conversion;
  obtaining the higher harmonic frequency response of the second frequency band from the chirp signal of the second frequency band and the second kernel function.

In addition, the chirp signal is calculated by the following formula:

$$x(t) = a(t)\sin\left[2\pi f_1 L \, \exp\left(\frac{t}{L}\right)\right]$$

$$L = \frac{T}{\ln\left(\frac{f_2}{f_1}\right)}$$

where, f1 is the start frequency of the chirp signal, a(t) is the amplitude, and t is the time, that is, a(t) is the function of the frequency that changes with time, T is the length of the chirp signal, and f2 is the chirp signal cut-off frequency.

The present invention further provides a nonlinear system modeling method for a motor including steps of:

obtaining chirp signals of multiple different frequency bands in a working frequency of the motor; wherein, among the multiple different frequency bands, a start frequency of one frequency band is a start frequency of the working frequency of the motor; a cut-off frequency of a frequency band that is a cut-off frequency of the working frequency of the motor, and the multiple different frequency bands form the working frequency of the motor;

exciting the motor by the chirp signal of each frequency band, and obtaining an output corresponding to each frequency band;

obtaining a higher harmonic frequency response of each frequency band according to the output corresponding to each frequency band and the chirp signal of each frequency band to obtain higher harmonic frequency responses of multiple frequency bands;

obtaining a higher harmonic frequency response of the working frequency of the motor by splicing the higher harmonic frequency response of multiple frequency bands in the frequency domain; wherein the higher harmonic frequency response of the working frequency of the motor is a nonlinear system model of the motor.

The present invention further provides a non-linear system modeling device of a motor, including:

an obtaining module for obtaining a chirp signal of a first frequency band in a working frequency of the motor and a chirp signal of a second frequency band in the working frequency of the motor; wherein a start frequency of the first frequency band is a start frequency of the working frequency of the motor; a cut-off frequency of the second frequency band is a cut-off frequency of the working frequency of the motor; the first frequency band partially overlaps the second frequency band;

a first excitation module to excite the motor with the chirp signal of the first frequency band for obtaining a first output and a higher harmonic frequency response of the first frequency band according to the first output and the chirp signal of the first frequency band;

a second excitation module to excite the motor with the chirp signal of the second frequency band for obtaining a second output and a higher harmonic frequency response of the second frequency band according to the second output and the chirp signal of the second frequency band;

a splicing module to splice the higher harmonic frequency response of the first frequency band and the higher harmonic frequency response of the second frequency band in the frequency domain for obtaining a higher harmonic frequency response of the working frequency of the motor; and wherein the higher harmonic frequency response of the working frequency of the motor is a nonlinear system model of the motor.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

FIG. 1 is a flow chart of a nonlinear system modeling method provided by a first embodiment of the present invention.

FIG. 7 is a flow chart of a nonlinear system modeling method provided by a third embodiment of the present invention.

DETAILED DESCRIPTION OF THE EXEMPLARY EMBODIMENTS

Figure 2:
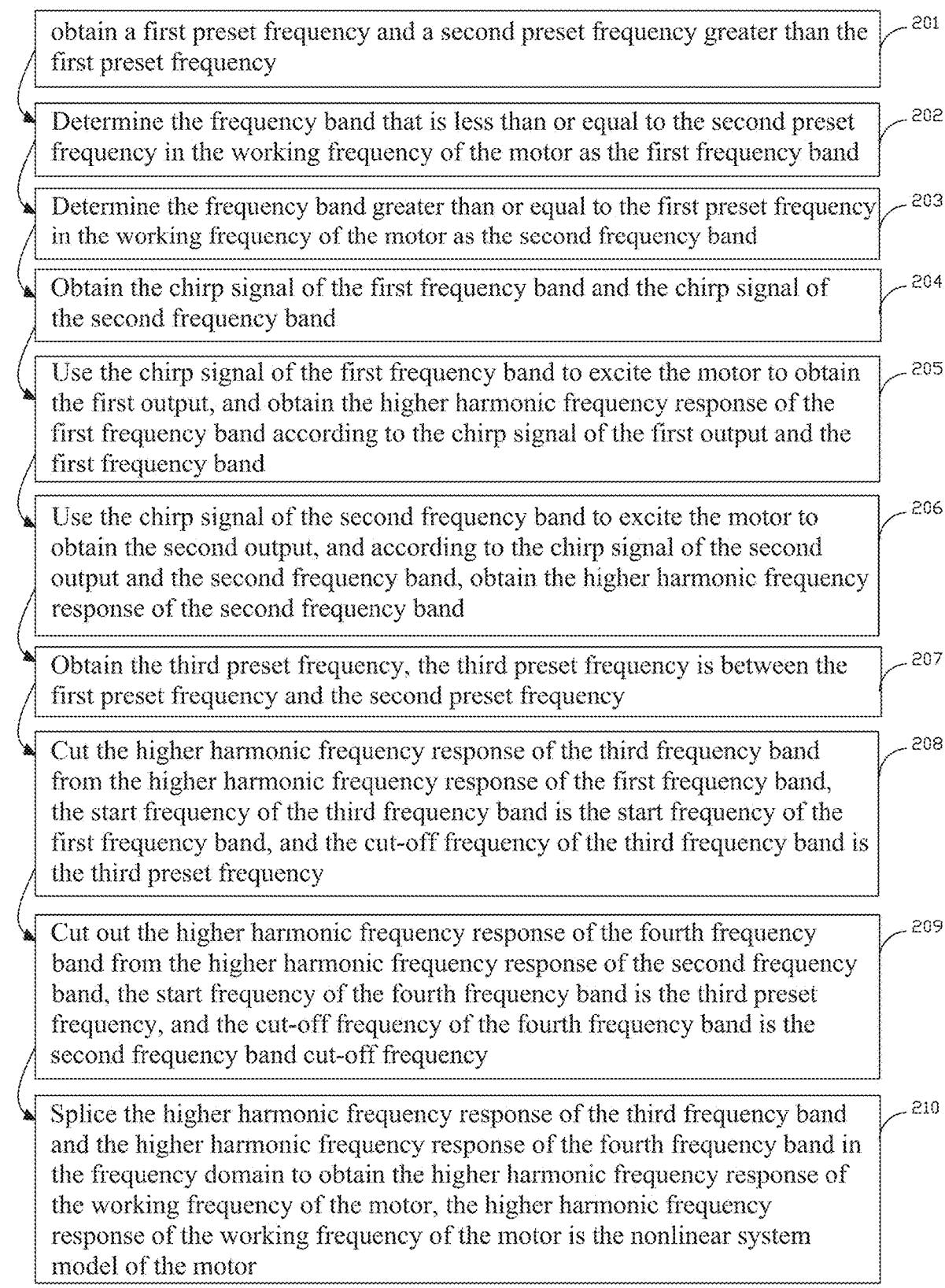
FIG. 2 is a flow chart of a nonlinear system modeling method provided by a second embodiment of the present invention.

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Please refer to FIG. 1. FIG. 1 is a schematic view of the first process of the motor nonlinear system modeling method provided by the embodiment of the present invention. The process may include:

101. Obtain the chirp signal of the first frequency band in the working frequency of the motor and the chirp signal of the second frequency band in the working frequency of the motor. The start frequency of the first frequency band is the start frequency of the working frequency of the motor. The cut-off frequency of the second frequency band is the cut-off frequency of the working frequency of the motor. The first frequency band and the second frequency band partially overlap.

The linear motor system does not conform to the Hammerstein model, and the kernel function under different voltages is different, and the kernel function under one voltage is used for other voltages, which will cause large errors. Because the limit voltage at f0 is small, and when the voltage is large, there is an out-of-phase shelling phenomenon at a specific frequency (the shelling phenomenon is that the motor vibrator hits the motor outer wall. In actual use, this phenomenon should be avoided as much as possible), so that the amplitude that can be used for identification of the constant amplitude chirp signal is limited to a small voltage range, and it is impossible to model the system function at a large voltage.

Variable amplitude exponential chirp signal system identification can avoid this limitation by designing the amplitude of different frequencies. Like the step sequence signal, the sequence frequency and amplitude can be arbitrarily designed. The step signal is in the form of a segment of a single-frequency continuous signal, and the frequency gradually changes between each segment, like a step (step). The chirp signal is a continuous signal with continuous changes in frequency.

However, using the variable amplitude exponential chirp signal to directly perform the working frequency of the motor (such as 5 Hz to 500 Hz frequency band). the accuracy of the nonlinear system model of the motor identified by the chirp signal is low, such as in the low frequency band (5 Hz to 120 Hz). Large error.

When dividing the working frequency of the motor into two overlapping frequency bands, such as the first frequency band and the second frequency band, model the chirp signal of the first frequency band and the chirp of the second frequency band to obtain the nonlinearity of the motor. the accuracy of the system model is relatively high. Wherein, the first frequency band and the second frequency band partially overlap. For example, the first frequency band can be a frequency band of 5 Hz to 150 Hz, and the second frequency band can be a frequency band of 100 Hz to 500 Hz.

In the embodiment of the present invention, the chirp signal of the first frequency band in the working frequency of the motor and the chirp signal of the second frequency band in the working frequency of the motor can be obtained. Wherein, the start frequency of the first frequency band is the start frequency of the working frequency of the motor, and the cut-off frequency of the second frequency band is the cut-off frequency of the working frequency of the motor. For the cut-off frequency of the first frequency band and the start frequency of the second frequency band, the embodiment of the present invention may not be limited, and actual requirements shall prevail. For example, if the working frequency of the motor is 5 Hz to 500 Hz frequency band, chirp signal of 5 Hz to 150 Hz frequency band and chirp signal of 100 Hz to 500 Hz frequency band can be obtained. Alternatively, a chirp signal with a frequency band of 5 Hz to 130 Hz and a chirp signal with a frequency band of 130 Hz to 500 Hz can be obtained. Wherein, the chirp signal of the first frequency band and the chirp signal of the second frequency band can be generated by electronic equipment according to certain rules.

It should be noted that the frequency band from 5 Hz to 500 Hz is only an example of the working frequency of the embodiment for the motor in the present invention, and is not used to limit the present invention.

102. Use the chirp signal of the first frequency band to excite the motor to obtain the first output. And according to the chirp signal of the first output and the first frequency band, the higher harmonic frequency response of the first frequency band is obtained.

For example, when the first frequency band is 5 Hz to 150 Hz frequency band and the second frequency band is 100 Hz to 500 Hz frequency band, the chirp signal of 5 Hz to 150 Hz frequency band can be used to excite the motor to obtain the first output. And according to the first output and the chirp signal of the frequency band of 5 Hz to 150 Hz, the higher harmonic frequency response of the frequency band of 5 Hz to 150 Hz is obtained. The higher harmonic frequency response of the 5 Hz to 150 Hz frequency band has higher accuracy in the 5 Hz to 150 Hz frequency band.

103. Use the chirp signal of the second frequency band to excite the motor to obtain the second output. And according to the chirp signal of the second output and the second frequency band, the higher harmonic frequency response of the second frequency band is obtained.

For example, when the second frequency band is 5 Hz to 150 Hz frequency band and the second frequency band is 100 Hz to 500 Hz frequency band, the chirp signal of 100 Hz to 500 Hz frequency band can be used to excite the motor to obtain the second output. And according to the second output and the chirp signal of the frequency band of 100 Hz to 500 Hz, the higher harmonic frequency response of the frequency band of 100 Hz to 500 Hz is obtained. The higher harmonic frequency response of the 100 Hz to 500 Hz frequency band has higher accuracy in the 100 Hz to 500 Hz frequency band.

104. The higher harmonic frequency response of the first frequency band and the higher harmonic frequency response of the second frequency band are spliced in the frequency domain to obtain the higher harmonic frequency response of the working frequency of the motor. The higher harmonic frequency response of the working frequency of the motor is the nonlinear system model of the motor.

For example, when the first frequency band is 5 Hz to 150 Hz frequency band and the second frequency band is 100 Hz to 500 Hz frequency band; when the higher harmonic frequency response from 5 Hz to 150 Hz frequency band and the higher harmonic frequency response from 100 Hz to 500 Hz frequency band are obtained; the higher harmonic frequency response from 5 Hz to 150 Hz frequency band and the higher harmonic frequency response from 100 Hz to 500 Hz frequency band can be spliced in the frequency domain. Thus, the higher harmonic frequency response of the frequency band from 5 Hz to 500 Hz is obtained, that is, the higher harmonic frequency response of the working frequency of the motor is obtained. The higher harmonic frequency response of the working frequency of the motor is the nonlinear system model of the motor such as a linear motor.

It should be noted that the embodiment of the present invention does not limit the specific splicing method. Any splicing method can be used to splice the higher harmonic frequency response of the first frequency band and the higher harmonic frequency response of the second frequency band in the frequency domain, in order to obtain the higher harmonic frequency response of the working frequency of the motor.

It is understandable that the nonlinear system model based on the linear motor can achieve precise control of the linear motor system.

In the embodiment of the present invention, the chirp signal of the working frequency of the motor is divided into the chirp signal of the first frequency band and the chirp signal of the second frequency band. The higher harmonic frequency response of the first frequency band and the higher harmonic frequency response of the second frequency band are obtained based on the chirp signal of the first frequency band and the chirp signal of the second frequency band, respectively. Based on the higher harmonic frequency response of the first frequency band and the higher harmonic frequency response of the second frequency band, the higher harmonic frequency response of the working frequency of the motor is finally concatenated. Thus, the working frequency excitation signal modeling of the motor is completed. Because the higher harmonic frequency response of the first frequency band and the higher harmonic frequency response of the second frequency band have higher accuracy. Therefore, the higher harmonic frequency response of the working frequency of the motor is finally spliced based on the higher harmonic frequency response of the first frequency band and the higher harmonic frequency response of the second frequency band, that is, the accuracy of the nonlinear system model of the motor is higher.

In some embodiments, the nonlinear system modeling method of the motor can also include:

Obtain first preset frequency and second preset frequency, first preset frequency is less than second preset frequency.

Determine the frequency band that is less than or equal to the second preset frequency in the working frequency of the motor as the first frequency band.

Determine the frequency band greater than or equal to the first preset frequency in the working frequency of the motor as the second frequency band.

Splice the higher harmonic frequency response of the first frequency band and the higher harmonic frequency response of the second frequency band in the frequency domain to obtain the higher harmonic frequency response of the working frequency of the motor, including:

Obtain the third preset frequency, the third preset frequency is between the first preset frequency and the second preset frequency.

Cut the higher harmonic frequency response of the third frequency band from the higher harmonic frequency response of the first frequency band, the start frequency of the third frequency band is the start frequency of the first frequency band, and the cut-off frequency of the third frequency band is the third preset frequency.

Cut the higher harmonic frequency response of the fourth frequency band from the higher harmonic frequency response of the second frequency band. the start frequency of the fourth frequency band is the third preset frequency, and the cut-off frequency of the fourth frequency band is the higher harmonic of the second frequency band. the cut-off frequency of frequency response.

Splice the higher harmonic frequency response of the third frequency band and the higher harmonic frequency response of the fourth frequency band in the frequency domain to obtain the higher harmonic frequency response of the working frequency of the motor.

Wherein, first preset frequency, second preset frequency and third preset frequency can be set by technicians based on experience or experiment. For example, you can set the first preset frequency to 100 Hz, the second preset frequency to 150 Hz, and the third preset frequency to 120 Hz. For another example, you can set the first frequency to 110 Hz, the second preset frequency to 140 Hz, and the third preset frequency to 130 Hz.

In some embodiments, due to the low frequency band (5 Hz to 150 Hz) linear motor system model identification, the identification results at the frequency range of 140 Hz to 150 Hz will be inaccurate. In the high frequency band (100 Hz to 500 Hz) linear motor system model identification, the 100 Hz to 110 Hz identification result will decrease. In order to eliminate this inaccuracy, first preset frequency and second preset frequency can also be selected from 110 Hz to 140 Hz frequency band. For example, the first preset frequency can be 110 Hz, and the second preset frequency can be 140 Hz. Or, the first preset frequency can be 120 Hz, the second preset frequency can be 130 Hz, and so on. In some embodiments, in order to further improve the accuracy, the first preset frequency and second preset frequency are selected in the frequency band from 110 Hz to 140 Hz. The endpoint value may not be selected, namely 110 Hz and 140 Hz as the first preset frequency and second preset frequency respectively.

In some embodiments, due to the low frequency band (5 Hz to 150 Hz) linear motor system model identification, the identification results at the frequency range of 140 Hz to 150 Hz will be inaccurate. In the high frequency band (100 Hz to 500 Hz) linear motor system model identification, the 100 Hz to 110 Hz identification result will decrease. In order to eliminate this inaccuracy, when the first preset frequency is less than or equal to 110 Hz, and the second preset frequency is greater than or equal to 140 Hz, select the third preset frequency from 110 Hz to 140 Hz. For example, the third preset frequency can be 120 Hz, 125 Hz, 130 Hz, etc. In some embodiment, in order to further improve the accuracy, select the third preset frequency in the frequency band from 110 Hz to 140 Hz. The endpoint value may not be selected, that is, 110 Hz and 140 Hz as the third preset frequency.

For example, assuming that working frequency of the motor is 5 Hz to 500 Hz, the first preset frequency is 100 Hz, and the second preset frequency is 150 Hz, then the first frequency band is 5 Hz to 150 Hz frequency band, and the second frequency band is 100 Hz to 500 Hz frequency band.

For another example, assuming that the working frequency of the motor is 5 Hz to 500 Hz, the first preset frequency is 110 Hz, and the second preset frequency is 140 Hz, the first frequency band is 5 Hz to 140 Hz frequency band, and the second frequency band is 110 Hz to 500 Hz frequency band.

For another example, assuming that the working frequency of the motor is 5 Hz to 500 Hz, the first preset frequency is 110 Hz, and the second preset frequency is 130 Hz, the first frequency band is 5 Hz to 130 Hz frequency band, and the second frequency band is 110 Hz to 500 Hz frequency band.

For example, assuming that the working frequency of the motor is 5 Hz to 500 Hz, and the third preset frequency is 120 Hz, the higher harmonic frequency response of the first frequency band is the higher harmonic frequency response of the frequency band of 5 to 150 Hz. And assuming that the higher harmonic frequency response of the second frequency band is the higher harmonic frequency response of the frequency band from 100 Hz to 500 Hz. Then the higher harmonic frequency response of the third frequency band is the higher harmonic frequency response of the frequency band from 5 Hz to 120 Hz. The higher harmonic frequency response of the fourth frequency band is the higher harmonic frequency response of the frequency band from 120 Hz to 500 Hz.

For example, assuming that the higher harmonic frequency response of the third frequency band is the higher harmonic frequency response of the frequency band from 5 Hz to 120 Hz. Assume that the higher harmonic frequency response of the fourth frequency band is the higher harmonic frequency response of the frequency band from 120 Hz to 500 Hz. Then, the higher harmonic frequency response of the frequency band of 5 Hz to 120 Hz and the higher harmonic frequency response of the frequency band of 120 Hz to 500 Hz can be spliced in the frequency domain. Obtain the higher harmonic frequency response from 5 Hz to 500 Hz frequency band. The higher harmonic frequency response of the frequency band from 5 Hz to 500 Hz can be a nonlinear system model of a linear motor.

In some embodiments, the nonlinear system modeling method of the motor can also include:

Obtain the fourth preset frequency.

Determine the frequency band that is less than or equal to the fourth preset frequency in the working frequency of the motor as the first frequency band.

Determine the frequency band greater than or equal to the fourth preset frequency in the working frequency of the motor as the second frequency band.

Wherein, the fourth preset frequency can be set by technicians based on experience or experiments. For example, due to the low frequency band (5 Hz to 150 Hz) linear motor system model identification, the identification results at the frequency range of 140 Hz to 150 Hz will be inaccurate. In the high frequency band (100 Hz to 500 Hz) linear motor system model identification, the 100 Hz to 110 Hz identification result will decrease. In order to eliminate this inaccuracy, the fourth preset frequency can be selected from the 110 Hz to 140 Hz frequency band. For example, the fourth preset frequency can be 120 Hz, 130 Hz, 135 Hz, etc. In some embodiments, in order to further improve the accuracy, the fourth preset frequency is selected in the frequency band from 110 Hz to 140 Hz. The endpoint value may not be selected, namely 110 Hz and 140 Hz as the fourth preset frequency.

Assuming that the working frequency of the motor is 5 Hz to 500 Hz and the fourth preset frequency is 120 Hz, then the first frequency band is 5 Hz to 120 Hz frequency band, and the second frequency band is 120 Hz to 500 Hz frequency band.

In some embodiments, according to the chirp signal of the first output and the first frequency band, the higher harmonic frequency response of the first frequency band is obtained, which can include:

Use Fourier transform on first output to obtain first frequency domain response.

According to the first frequency domain response, use the inverse signal frequency domain analysis of the chirp signal of the first frequency band to calculate the first response function of the motor system.

Use the first response function to convert through the conversion matrix to obtain the first kernel function.

Obtain the higher harmonic frequency response of the first frequency band from the chirp signal and first kernel function of the first frequency band.

According to the chirp signal of the second output and the second frequency band, the higher harmonic frequency response of the second frequency band is obtained, which can include:

Use Fourier transform on second output to obtain second frequency domain response.

According to the second frequency domain response, use the inverse signal frequency domain of the chirp signal of the second frequency band to analyze and calculate the second response function of the motor system.

Use the second response function to convert to the second kernel function through the conversion matrix.

Obtain the higher harmonic frequency response of the second frequency band from the chirp signal and second kernel function of the second frequency band.

Wherein, the frequency domain response can be obtained according to formula (1).

$$Y = fft(y) \quad (1)$$

Wherein, y is output, such as first output or second output, and Y is frequency domain response, such as first frequency domain response or second frequency domain response.

The response function can be obtained according to formula (2).

$$H(t) = Y * X\_ * 1/a(t) \quad (2)$$

Wherein, Y is frequency domain response. For example, the first frequency domain response or second frequency domain response, X_ is the inverse signal frequency domain analysis of the chirp signal; such as the inverse signal frequency domain analysis of the chirp signal of the first frequency band or the inverse signal frequency domain analysis of the chirp signal of the second frequency band, a(t) is the amplitude.

The kernel function can be obtained according to formula (3).

$$Ki(t) = AHi(t) \quad (3)$$

Wherein, K i (t) is the kernel function, such as the first kernel function or the second kernel function, a is the conversion matrix, Hi (t) is the motor system response of the i-th harmonic response, and i is a natural number.

Wherein, a 0 is the constant amplitude of a(t), and the relationship between the two is: a 0 is the constant amplitude of a(t), where the formula between a(t) and a0 is: a(t)=a 0·γ(t), which is a normalized variable voltage curve. In practice, the amplitude a(t) is mostly a fixed value a0, and the amplitude is lowered only at certain frequency points where the motor is easy to shell.

When the order of the kernel function is 5, the conversion matrix a is expressed as:

$$A = <1> \begin{pmatrix} 1 & 0 & -3 & 0 & 5 \\ 0 & -\dfrac{2}{a(t)} & 0 & \dfrac{8}{a(t)} & 0 \\ 00 & & \dfrac{4}{a(t)^2} & 0 & -\dfrac{20}{a_0^2} \\ 0 & 0 & 0 & -\dfrac{8}{a(t)^3} & 0 \\ 0 & 0 & 0 & 0 & -\dfrac{16}{a(t)^4} \end{pmatrix}$$

The higher harmonic frequency response can be obtained according to formula (4).

$$y\_est(t) = \Sigma_i x^i(t) * K_i(t) \quad (4)$$

Wherein, y_est(t) is the higher harmonic frequency response, for example, the higher harmonic frequency response of the first frequency band or the higher harmonic frequency response of the second frequency band, t is the time, and x(t) is the input chirp signal. For example, for the chirp signal of the first frequency band or the chirp signal of the second frequency band, Ki(t) is the i-th order kernel function. For example, the i-th order first kernel function or the i-th order second kernel function, i is a natural number.

In the embodiment of the present invention, after the chirp signal of the frequency band of 5 Hz to 150 Hz is obtained, the chirp signal of the frequency band of 5 Hz to 150 Hz can be used to excite the motor to obtain the first output. After the first output is obtained, the first frequency domain response can be obtained according to the first output and formula (1). After the first frequency domain response is obtained, the first response function of the motor system can be obtained according to the first frequency domain response, the inverse signal frequency domain of the chirp signal of the frequency band from 5 Hz to 150 Hz, based on the analysis and formula (2). After the first response function is obtained, the first kernel function can be obtained according to the first response function and formula (3). After the first kernel function is obtained, the higher harmonic frequency response of the first frequency band can be obtained according to the chirp signal of the frequency band from 5 Hz to 150 Hz, the first kernel function and formula (4).

Similarly, in the embodiment of the present invention, after the chirp signal of the frequency band of 100 Hz to 5000 Hz is obtained, the chirp signal of the frequency band of 100 Hz to 500 Hz can be used to excite the motor to obtain the second output. After the second output is obtained, the second frequency domain response can be obtained according to the second output and formula (1). After the second frequency domain response is obtained, the second response function of the motor system can be obtained according to the second frequency domain response, the inverse signal frequency domain of the chirp signal of the frequency band from 5 Hz to 150 Hz, and based on analysis and formula and (2). After the second response function is obtained, the second kernel function can be obtained according to the second response function and formula (3). After the second kernel function is obtained, the higher harmonic frequency response of the second frequency band can be obtained according to the chirp signal of the frequency band from 5 Hz to 150 Hz, the second kernel function and formula (4).

In some embodiments, the chirp signal is calculated by formula (5):

$$x(t) = a(t)\sin\left[2\pi f_1 L \exp\left(\frac{t}{L}\right)\right] \quad (5)$$

Wherein, $$L = \frac{T}{\ln\left(\frac{f_2}{f_1}\right)}$$

Wherein, f1 is the start frequency of the chirp signal, a(t) is the amplitude, t is the time, that is, a(t) is the function of the frequency varying with time, T is the chirp signal duration, and f2 is the chirp signal cut-off frequency.

For example, when the first frequency band is from 5 Hz to 150 Hz, then 5 Hz can be taken as f1 and 150 Hz as f2, and then substituted into formula (5) to obtain the chirp signal of the first frequency band. Similarly, when the second frequency band is 100 Hz to 500 Hz, then 100 Hz can be taken as f1 and 500 Hz can be taken as f2 and substituted into formula (5) to obtain the chirp signal of the second frequency band.

Please refer to FIG. 2. FIG. 2 is a schematic view of the second process of the method for modeling a nonlinear motor system provided by the embodiment of the present invention. the process may include:

201. Obtain the first preset frequency and second preset frequency. the first preset frequency is less than the second preset frequency.

Wherein, first preset frequency and second preset frequency can be set by technicians based on experience or experiment. For example, you can set the first preset frequency to 100 Hz and the second preset frequency to 150 Hz. For another example, you can set the first frequency to 110 Hz and the second preset frequency to 140 Hz.

In some embodiments, due to the low frequency band (5 Hz to 150 Hz) linear motor system model identification, the identification results at the frequency range of 140 Hz to 150 Hz will be inaccurate. In the high frequency band (100 Hz to 500 Hz) linear motor system model identification, the 100 Hz to 110 Hz identification result will decrease. In order to eliminate this inaccuracy, first preset frequency and second preset frequency can also be selected from 110 Hz to 140 Hz frequency band. For example, the first preset frequency can be 110 Hz, and the second preset frequency can be 140 Hz. Or, the first preset frequency can be 120 Hz, the second preset frequency can be 130 Hz, and so on. In some embodiments, in order to further improve the accuracy, the first preset frequency and second preset frequency are selected in the frequency band from 110 Hz to 140 Hz. The endpoint value may not be selected, namely 110 Hz and 140 Hz as the first preset frequency and second preset frequency respectively.

202. Determine the frequency band that is less than or equal to the second preset frequency in the working frequency of the motor as the first frequency band.

203. Determine the frequency band greater than or equal to the first preset frequency in the working frequency of the motor as the second frequency band.

For example, assuming that the working frequency of the motor is 5 Hz to 500 Hz, the first preset frequency is 100 Hz, and the second preset frequency is 150 Hz; then the first frequency band is 5 Hz to 150 Hz frequency band, and the second frequency band is 100 Hz to 500 Hz frequency band.

For another example, assuming that the working frequency of the motor is 5 Hz to 500 Hz, the first preset frequency is 110 Hz, and the second preset frequency is 140 Hz, the first frequency band is 5 Hz to 140 Hz frequency band, and the second frequency band is 110 Hz to 500 Hz frequency band.

For another example, assuming that the working frequency of the motor is 5 Hz to 500 Hz, the first preset frequency is 110 Hz, and the second preset frequency is 130 Hz, the first frequency band is 5 Hz to 130 Hz frequency band, and the second frequency band is 110 Hz to 500 Hz frequency band.

204. Obtain the chirp signal of the first frequency band and the chirp signal of the second frequency band.

Wherein, the chirp signal can be calculated by formula (5). For example, when the first frequency band is from 5 Hz to 150 Hz, then 5 Hz can be taken as f1 and 150 Hz as f2, and then substituted into formula (5) to obtain the chirp signal of the first frequency band. Similarly, when the second frequency band is 100 Hz to 500 Hz, then 100 Hz can be taken as f1 and 500 Hz can be taken as f2 and substituted into formula (5) to obtain the chirp signal of the second frequency band.

205. Use the chirp signal of the first frequency band to excite the motor to obtain the first output, and obtain the higher harmonic frequency response of the first frequency band according to the chirp signal of the first output and the first frequency band.

206. Use the chirp signal of the second frequency band to excite the motor to obtain the second output. And according to the chirp signal of the second output and the second frequency band, the higher harmonic frequency response of the second frequency band is obtained.

In the embodiment of the present invention, after the chirp signal of the frequency band of 5 Hz to 150 Hz is obtained, the chirp signal of the frequency band of 5 Hz to 150 Hz can be used to excite the motor to obtain the first output. After the first output is obtained, the first frequency domain response can be obtained according to the first output and formula (1). After the first frequency domain response is obtained, the first response function of the motor system can be obtained according to the first frequency domain response, the inverse signal frequency domain of the chirp signal of the frequency band from 5 Hz to 150 Hz, based on the analysis and formula (2). After the first response function is obtained, the first kernel function can be obtained according to the first response function and formula (3). After the first kernel function is obtained, the higher harmonic frequency response of the first frequency band can be obtained according to the chirp signal of the frequency band from 5 Hz to 150 Hz, the first kernel function and formula (4).

Similarly, in the embodiment of the present invention, after the chirp signal of the frequency band of 100 Hz to 5000 Hz is obtained, the chirp signal of the frequency band of 100 Hz to 500 Hz can be used to excite the motor to obtain the second output. After the second output is obtained, the second frequency domain response can be obtained according to the second output and formula (1). After the second frequency domain response is obtained, the second response function of the motor system can be obtained according to the second frequency domain response, the inverse signal frequency domain of the chirp signal of the frequency band from 5 Hz to 150 Hz, and based on analysis and formula and (2). After the second response function is obtained, the second kernel function can be obtained according to the second response function and formula (3). After the second kernel function is obtained, the higher harmonic frequency response of the second frequency band can be obtained according to the chirp signal of the frequency band from 5 Hz to 150 Hz, the second kernel function and formula (4).

207. Obtain the third preset frequency. the third preset frequency is between the first preset frequency and the second preset frequency.

Wherein, the third preset frequency can be set by technicians based on experience or experiment. For example, if the first preset frequency is 100 Hz and the second preset frequency is 150 Hz, the third preset frequency can be 120 Hz, 130 Hz, etc.

In some embodiments, due to the low frequency band (5 Hz to 150 Hz) linear motor system model identification, the identification results at the frequency range of 140 Hz to 150 Hz will be inaccurate. In the high frequency band (100 Hz to 500 Hz) linear motor system model identification, the 100 Hz to 110 Hz identification result will decrease. In order to eliminate this inaccuracy, when the first preset frequency is less than or equal to 110 Hz, and the second preset frequency is greater than or equal to 140 Hz, select the third preset frequency from 110 Hz to 140 Hz. For example, the third preset frequency can be 120 Hz, 125 Hz, 130 Hz, etc. In some embodiments, in order to further improve the accuracy, the third preset frequency is selected in the frequency band from 110 Hz to 140 Hz, and the endpoint values may not be selected, that is, 110 Hz and 140 Hz as the third preset frequency.

208. Cut the higher harmonic frequency response of the third frequency band from the higher harmonic frequency response of the first frequency band, the start frequency of the third frequency band is the start frequency of the first frequency band, and the cut-off frequency of the third frequency band is the third preset frequency.

209. Cut out the higher harmonic frequency response of the fourth frequency band from the higher harmonic frequency response of the second frequency band, the start frequency of the fourth frequency band is the third preset frequency, and the cut-off frequency of the fourth frequency band is the second frequency band cut-off frequency.

For example, assuming that the working frequency of the motor is 5 Hz to 500 Hz, the third preset frequency is 120 Hz, the higher harmonic frequency response of the first frequency band is 5 Hz to 150 Hz, and the higher harmonic frequency response of the second frequency band is 100 Hz to 500 Hz frequency band the higher harmonic frequency response of the third frequency band is the higher harmonic frequency response of the frequency band of 5 Hz to 120 Hz, and the higher harmonic frequency response of the fourth frequency band is the higher harmonic frequency response of the frequency band of 120 Hz to 500 Hz.

210. Splice the higher harmonic frequency response of the third frequency band and the higher harmonic frequency response of the fourth frequency band in the frequency domain to obtain the higher harmonic frequency response of the working frequency of the motor. The higher harmonic frequency response of the working frequency of the motor is the nonlinear system model of the motor.

For example, assuming that the higher harmonic frequency response of the third frequency band is the higher harmonic frequency response of the frequency band of 5 Hz to 120 Hz, and the higher harmonic frequency response of the fourth frequency band is the higher harmonic frequency response of the frequency band of 120 Hz to 500 Hz . . . . Then, the higher harmonic frequency response of the frequency band of 5 Hz to 120 Hz and the higher harmonic frequency response of the frequency band of 120 Hz to 500 Hz can be spliced in the frequency domain to obtain the higher harmonic frequency response of the frequency band of 5 Hz to 500 Hz. The higher harmonic frequency response of the frequency band from 5 Hz to 500 Hz can be a nonlinear system model of a linear motor.

Figure 3:
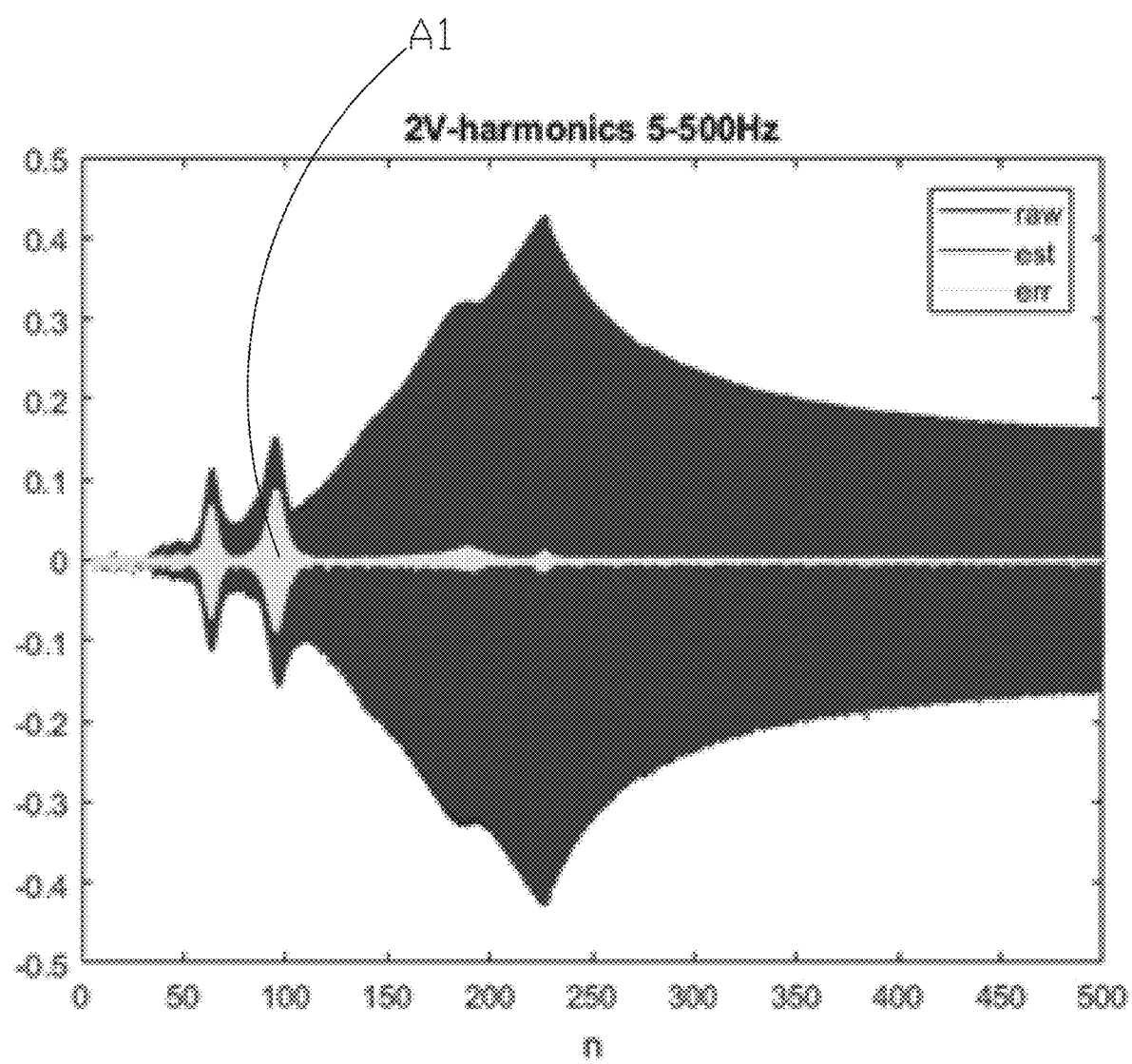
FIG. 3 is a schematic view of a first test result.
Figure 4:
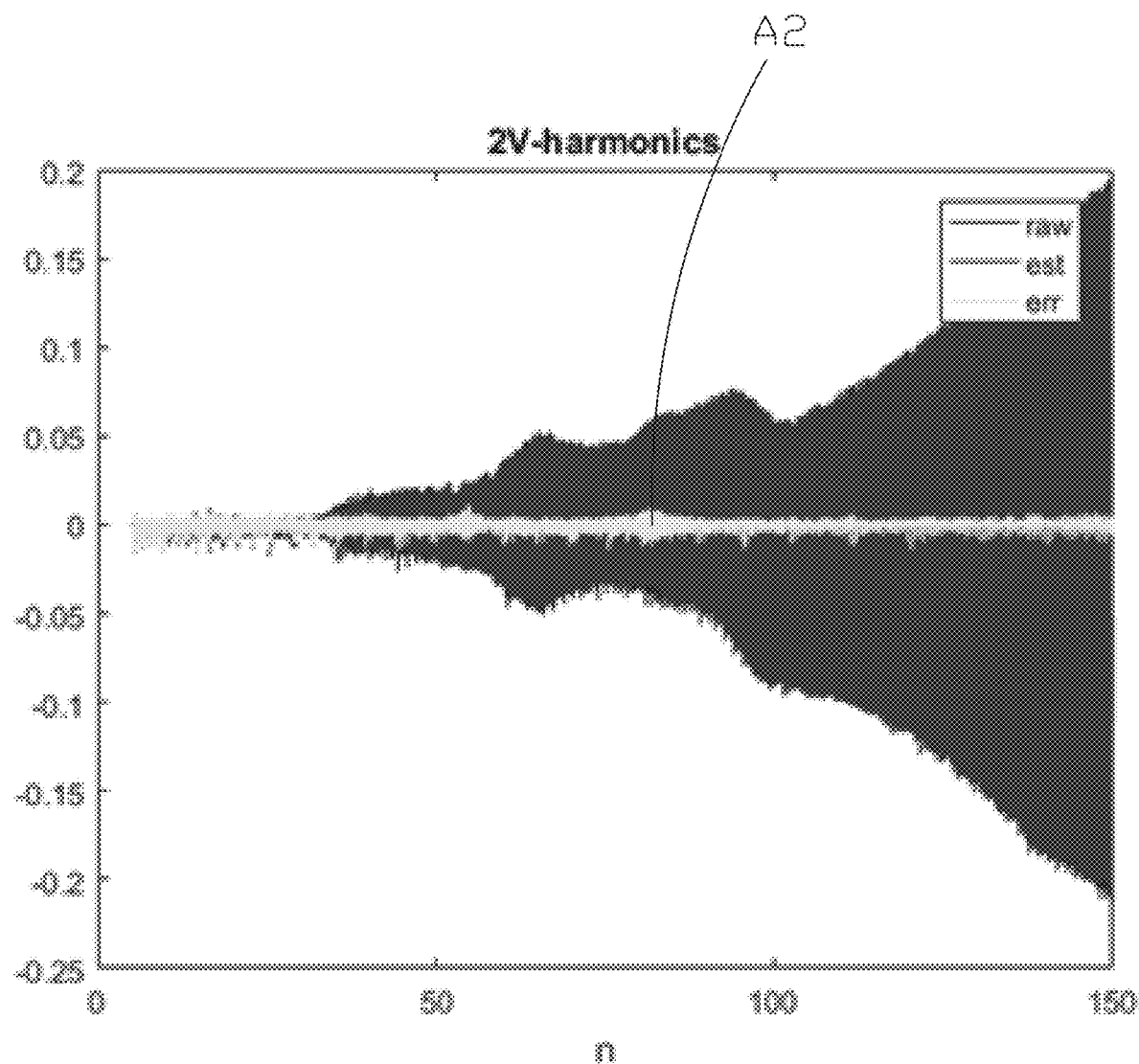
FIG. 4 is a schematic view of a second test result.
Figure 5:
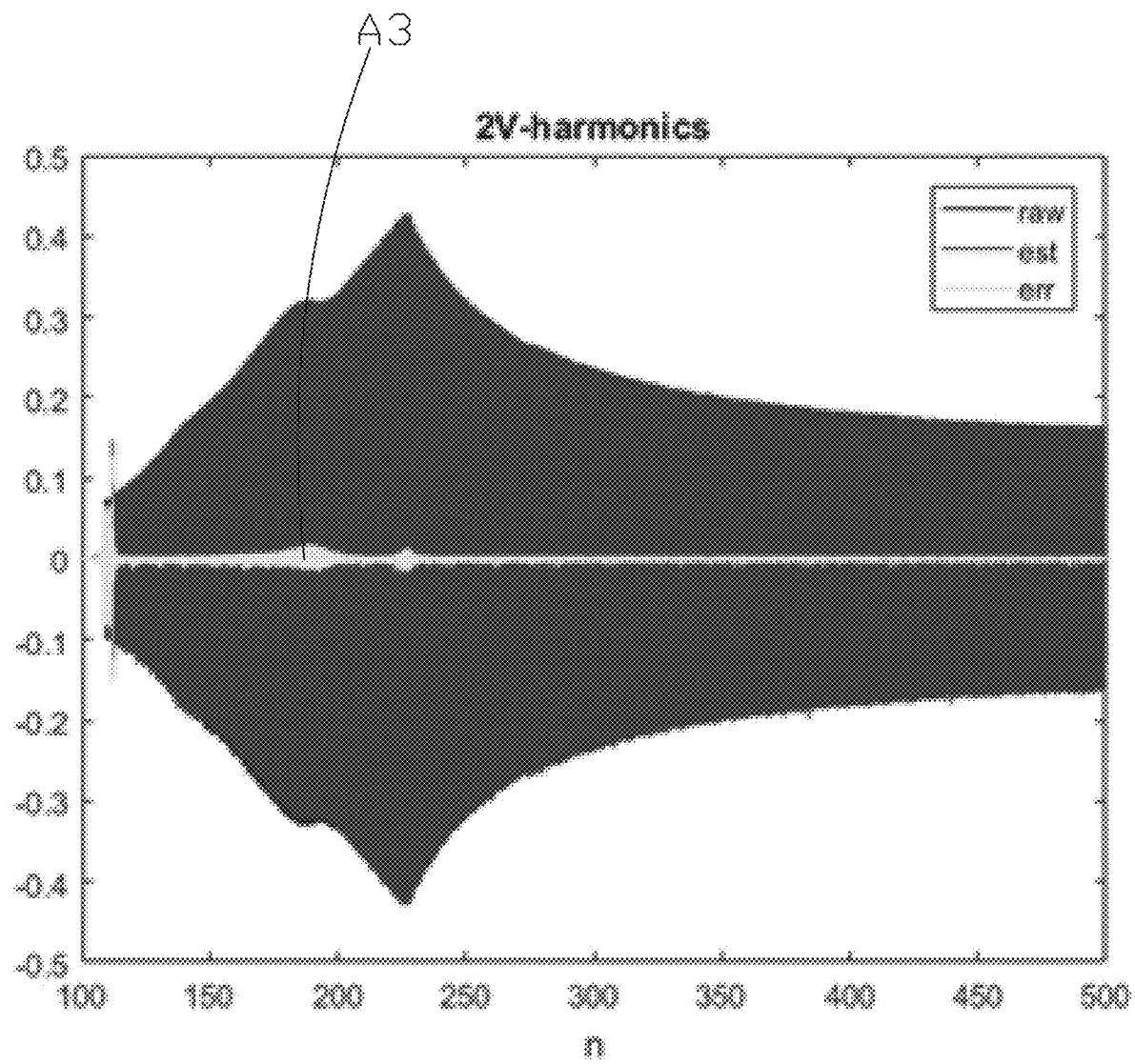
FIG. 5 is a schematic view of a third test result.
Figure 6:
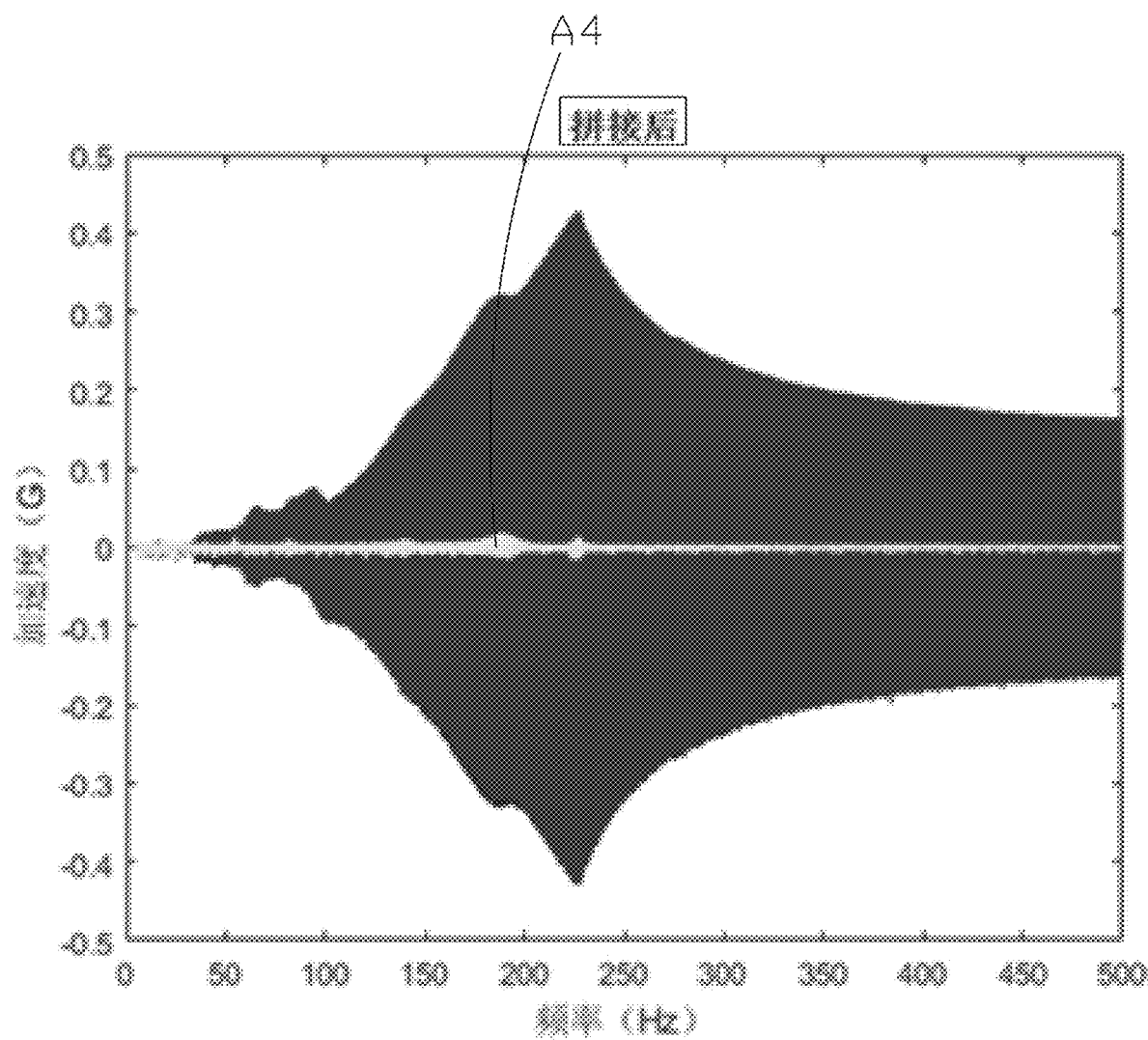
FIG. 6 is a schematic view of a fourth test result.

Please refer to FIGS. 3 to 6 together. FIG. 3 is a schematic view of the first test result provided by the embodiment of the present invention. FIG. 4 is a schematic view of the second test result provided by the embodiment of the present invention. FIG. 5 is a schematic view of the third test result provided by the embodiment of the present invention. FIG. 6 is a schematic view of the fourth test result provided by the embodiment of the present invention.

Wherein, the first test result is: Directly use the chirp signal of the motor's working frequency (5 Hz to 500 Hz frequency band) to excite the motor of the model AAC SLA1010# to obtain the corresponding output. the test result of the higher harmonic frequency response of the working frequency of the motor is obtained according to the corresponding output and the chirp signal of the 5 Hz to 500 Hz frequency band. Wherein, A1 represents the error value between the measured value and the model value. It can be seen that, in the test result of the higher harmonic frequency response of the working frequency of the motor that is obtained by directly using the chirp signal of the working frequency of the motor to excite the motor, there is a large error in the frequency band of 5 Hz to 120 Hz. Wherein, in FIG. 3, the abscissa represents frequency, and the ordinate represents acceleration. Directly use the chirp signal of the motor's working frequency (5 Hz to 500 Hz frequency band) to excite the motor model AAC SLA1010 #, and obtain the corresponding output. The process of obtaining the higher harmonic frequency response of the working frequency of the motor according to the corresponding output and the chirp signal of the frequency band from 5 Hz to 500 Hz refers to the process during which the chirp signal system identification establishes modeling for working frequency excitation signal of the motor and obtains nonlinear system model of the motor.

The second test result is: Use the chirp signal of the first frequency band (5 Hz to 150 Hz frequency band) in the working frequency of the motor (5 Hz to 500 Hz frequency band) to excite the motor model AAC SLA1010 # to obtain the first output. And according to the first output and the chirp signal of the frequency band of 5 Hz to 150 Hz, the test result of the higher harmonic frequency response of the frequency band of 5 Hz to 150 Hz is obtained. Wherein, A2 represents the error value between the measured value and the model value. It can be seen that in the test results of the higher harmonic frequency response of the 5 Hz to 150 Hz frequency band finally obtained by using the chirp signal of the 5 Hz to 150 Hz frequency band to excite the motor, there is a small error in the 5 Hz to 150 Hz frequency band. Wherein, in FIG. 4, the abscissa represents frequency, and the ordinate represents acceleration.

The third test result is: Use the chirp signal of the second frequency band (100 Hz to 500 Hz frequency band) in the working frequency of the motor (5 Hz to 500 Hz frequency band) to excite the motor with model AAC SLA1010 # to obtain the second output. And according to the second output and the chirp signal of the frequency band of 100 Hz to 500 Hz, the test result of the higher harmonic frequency response of the frequency band of 100 Hz to 500 Hz is obtained. Wherein, A3 represents the error value between the measured value and the model value. It can be seen that the test result of the higher harmonic frequency response of the 100 Hz to 500 Hz frequency band obtained by using the chirp signal of the 100 Hz to 500 Hz frequency band to excite the motor, only has a higher harmonic frequency response in the 100 Hz to 110 Hz frequency band. Big error. The frequency band from 110 Hz to 500 Hz has a small error. Wherein, in FIG. 5, the abscissa represents frequency, and the ordinate represents acceleration.

The fourth test result is: Intercept the higher harmonic frequency response of the 5 Hz to 120 Hz frequency band in the higher harmonic frequency response of the 5 Hz to 150 Hz frequency band, and intercept the higher harmonic frequency response of the 120 Hz to 500 Hz frequency band in the higher harmonic frequency response of the 100 Hz to 500 Hz frequency band. In the frequency domain, the higher harmonic frequency response of the frequency band of 5 Hz to 120 Hz and the higher harmonic frequency response of the frequency band of 120 Hz to 500 Hz are spliced together to obtain the test result of the higher harmonic frequency response of the working frequency of the motor (5 Hz to 500 Hz frequency band). Wherein, A4 represents the error value between the measured value and the model value. It can be seen that in the test results of the higher harmonic frequency response of the working frequency of the motor finally obtained by splicing, the working frequency of the motor (5 Hz to 500 Hz frequency band) has a small error. Wherein, in FIG. 6, the abscissa represents frequency, and the ordinate represents acceleration.

Please refer to FIG. 7, which is a schematic view of the third process of the method for modeling the nonlinear system of motor provided by the embodiment of the present invention. The process can include:

301. Obtain chirp signals of multiple different frequency bands in the working frequency of the motor. Wherein, among multiple different frequency bands, there is one frequency band whose start frequency is the start frequency of the motor's working frequency. And there is a cut-off frequency of a frequency band whose cut-off frequency is the working frequency of motor. Multiple different frequency bands can form the working frequency of the motor.

In the embodiment of the present invention, the working frequency of the motor can be divided into multiple different frequency bands. For example, assuming that the working frequency of a motor is a frequency band of 5 Hz to 500 Hz, the working frequency of a motor can be divided into three different frequency bands. The first frequency band can be 5 Hz to 150 Hz frequency band. The second frequency band can be 100 Hz to 300 Hz frequency band. The third frequency band can be 200 Hz to 500 Hz frequency band. Wherein, the three different frequency bands can form the working frequency of the motor.

In some embodiments, it is assumed that multiple different frequency bands are 3 different frequency bands. The fifth preset frequency, sixth preset frequency, and seventh preset frequency can be set by the technician based on experience or experiment. Wherein, the fifth preset frequency is less than the sixth preset frequency, and the sixth preset frequency is less than the seventh preset frequency. The first frequency band can be determined according to multiple frequencies less than or equal to the sixth preset frequency in the working frequency of the motor. The second frequency band can be determined according to multiple frequencies greater than or equal to the fifth preset frequency and less than or equal to the seventh preset frequency in the working frequency of the motor. The third frequency can be determined according to multiple frequencies greater than or equal to the seventh preset frequency in the working frequency of the motor.

It should be noted that how to determine multiple different frequency bands can be referred to other embodiment, which will not be repeated here.

The chirp signals of multiple different frequency bands in the working frequency of the motor can be obtained as: Assuming that there are 3 different frequency bands. The first frequency band is from 5 Hz to 150 Hz. The second frequency band is 100 Hz to 300 Hz frequency band. The third frequency band is 200 Hz to 500 Hz frequency band. Then, the chirp signal in the frequency band of 5 Hz to 150 Hz, the chirp signal in the frequency band of 100 Hz to 300 Hz, and the chirp signal in the frequency band of 200 Hz to 500 Hz can be obtained. Wherein, the specific method of obtaining the chirp signal of each frequency band can be found in other embodiments, which will not be repeated here.

It should be noted that in the embodiment of the present invention, multiple includes "three" and "three" or more.

302. Use the chirp signal of each frequency band to excite the motor, and obtain the output corresponding to each frequency band.

303. Obtain the higher harmonic frequency response of each frequency band according to the output corresponding to each frequency band and the chirp signal of each frequency band. In order to obtain the higher harmonic frequency response of multiple frequency bands.

Assuming that there are 3 different frequency bands, the first frequency band is from 5 Hz to 150 Hz frequency band, the second frequency band is from 100 Hz to 300 Hz frequency band, and the third frequency band is from 200 Hz to 500 Hz frequency band. The chirp signal in the frequency band of 5 Hz to 150 Hz can be used to excite the motor to obtain the first output. And according to the first output and the chirp signal of the frequency band of 5 Hz to 150 Hz, the higher harmonic frequency response of the frequency band of 5 Hz to 150 Hz is obtained. The chirp signal in the frequency band of 100 Hz to 300 Hz can be used to excite the motor to obtain the second output. And according to the second output and the chirp signal of the frequency band of 100 Hz to 300 Hz, the higher harmonic frequency response of the frequency band of 100 Hz to 300 Hz is obtained. The chirp signal of 200 Hz to 500 Hz frequency band can be used to excite the motor to obtain the third output. And according to the third output and the chirp signal of the 200 Hz to 500 Hz frequency band, the higher harmonic frequency response of the 200 Hz to 500 Hz frequency band is obtained. Thus, the higher harmonic frequency response of 3 frequency bands can be obtained.

It needs to be explained that how to obtain the higher harmonic frequency response of each frequency band according to the output corresponding to each frequency band and the chirp signal of each frequency band can be referred to other embodiment, which will not be repeated here.

304. Splice the higher harmonic frequency responses of multiple frequency bands in the frequency domain to obtain the higher harmonic frequency response of the working frequency of the motor, and the higher harmonic frequency response of the working frequency of the motor is the nonlinear system model of the motor.

For example, assuming that a higher harmonic frequency response of a frequency band of 5 Hz to 150 Hz, a higher harmonic frequency response of a frequency band of 100 Hz to 300 Hz, and a higher harmonic frequency response of the frequency band of 200 Hz to 500 Hz are obtained. Then, the higher harmonic frequency response of the frequency band of 5 Hz to 150 Hz, the higher harmonic frequency response of the frequency band of 100 Hz to 300 Hz, and the higher harmonic frequency response of the frequency band of 200 Hz to 500 Hz can be spliced in the frequency domain. Thus, the higher harmonic frequency response of the frequency band from 5 Hz to 500 Hz is obtained, that is, the higher harmonic frequency response of the working frequency of the motor is obtained. The higher harmonic frequency response of the working frequency of the motor is the nonlinear system model of the motor such as a linear motor.

It should be noted that the embodiment of the present invention does not limit the specific splicing method. Any splicing method can be used to splice the higher harmonic frequency response of multiple frequency bands in the frequency domain to obtain the higher harmonic frequency response of the working frequency of the motor.

It is understandable that the nonlinear system model based on the linear motor can achieve precise control of the linear motor system.

Figure 8:
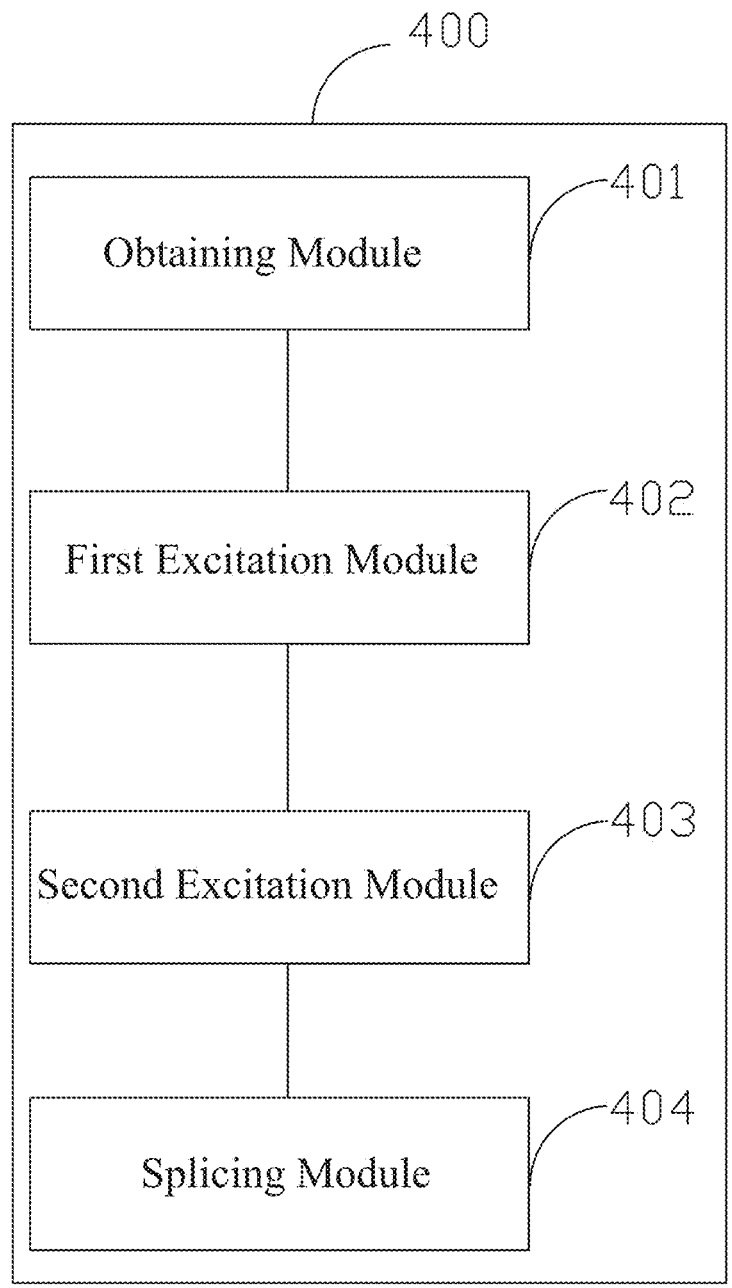
FIG. 8 is a schematic view of a first structure of a non-linear system modeling device.

Please refer to FIG. 8, which is a schematic view of the first structure of a modeling device of a non-linear motor system provided by the embodiment of the present invention. The non-linear system modeling device 400 of the motor can include: an obtain module 401, a first excitation module 402, a second excitation module 403, and a splicing module 404.

The obtain module 401 is used to obtain the chirp signal of the first frequency band in the working frequency of the motor and the chirp signal of the second frequency band in the working frequency of the motor. The start frequency of the first frequency band is the start frequency of the working frequency of the motor. The cut-off frequency of the second frequency band is the cut-off frequency of the working frequency of the motor. The first frequency band and the second frequency band partially overlap.

The first excitation module 402 is used to excite the motor by using the chirp signal of the first frequency band to obtain the first output. And according to the first output and the chirp signal of the first frequency band, the higher harmonic frequency response of the first frequency band is obtained.

The second excitation module 403 is used to excite the motor by using the chirp signal of the second frequency band to obtain a second output. And according to the second output and the chirp signal of the second frequency band, the higher harmonic frequency response of the second frequency band is obtained.

The splicing module 404 is used for splicing the higher harmonic frequency response of the first frequency band and the higher harmonic frequency response of the second frequency band in the frequency domain to obtain the higher harmonic frequency response of the working frequency of the motor. The higher harmonic frequency response of the working frequency of the motor is a nonlinear system model of the motor.

In some embodiments, obtain module 401, which can be used to: Obtain the first preset frequency and second preset frequency. The first preset frequency is smaller than the second preset frequency. The frequency band of the working frequency of the motor that is less than or equal to the second preset frequency is determined as the first frequency band. According to the working frequency of the motor, a frequency band greater than or equal to the first preset frequency is determined as the second frequency band.

splicing module 404 can be used to: Obtain the third preset frequency, the third preset frequency is between the first preset frequency and the second preset frequency. The higher harmonic frequency response of the third frequency band is truncated from the higher harmonic frequency response of the first frequency band. The start frequency of the third frequency band is the start frequency of the first frequency band. The cut-off frequency of the third frequency band is the third preset frequency. The higher harmonic frequency response of the fourth frequency band is truncated from the higher harmonic frequency response of the second frequency band. The start frequency of the fourth frequency band is the third preset frequency, and the cut-off frequency of the fourth frequency band is the cut-off frequency of the second frequency band. The higher harmonic frequency response of the third frequency band and the higher harmonic frequency response of the fourth frequency band are spliced in the frequency domain to obtain the higher harmonic frequency response of the working frequency of the motor.

In some embodiments, obtain module 401, which can be used to: Obtain the fourth preset frequency. The frequency band of the working frequency of the motor that is less than or equal to the fourth preset frequency is determined as the first frequency band. The frequency band greater than or equal to the fourth preset frequency in the working frequency of the motor is determined as the second frequency band.

In some embodiments, the first excitation module 402 can be used to: Use Fourier transform on the first output to obtain the first frequency domain response. According to the first frequency domain response, use the inverse signal frequency domain of the chirp signal of the first frequency band to analyze and calculate the first response function of the motor system. Use the first response function to obtain the first kernel function through conversion matrix conversion. The higher harmonic frequency response of the first frequency band is obtained from the chirp signal of the first frequency band and the first kernel function.

The second excitation module 403 can be used for: Use Fourier transform on the second output to obtain the second frequency domain response. According to the second frequency domain response, use the inverse signal frequency domain of the chirp signal of the second frequency band to analyze and calculate the second response function of the motor system. Use the second response function to obtain the second kernel function through conversion matrix conversion. The higher harmonic frequency response of the second frequency band is obtained from the chirp signal of the second frequency band and the second kernel function.

In some embodiments, the chirp signal is calculated by the following formula:

$$x(t) = a(t)\sin\left[2\pi f_1 L \, \exp\left(\frac{t}{L}\right)\right]$$

$$L = \frac{T}{\ln\left(\frac{f_2}{f_1}\right)}$$

Wherein, f1 is the start frequency of the chirp signal, a(t) is the amplitude, t is the time, that is, a(t) is the function of the frequency varying with time, T is the chirp signal duration, and f2 is the chirp signal cut-off frequency.

Figure 9:
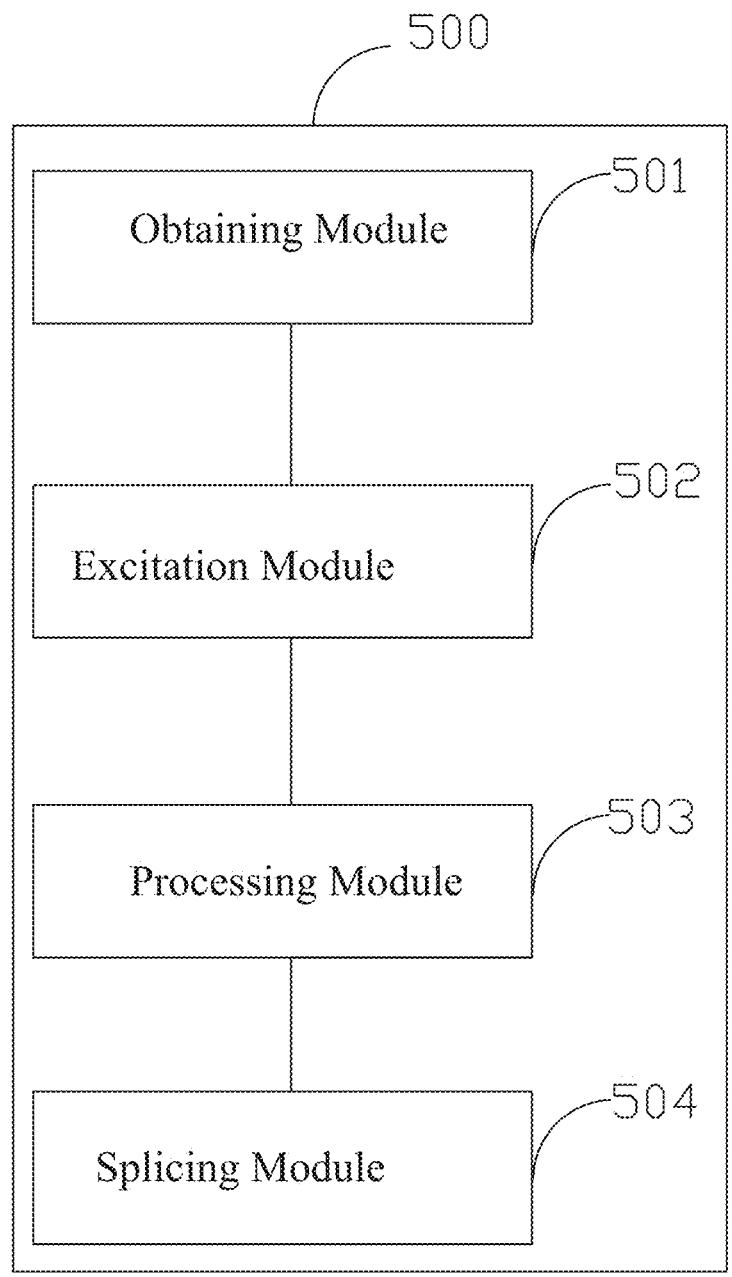
FIG. 9 is a schematic view of a second structure of a non-linear system modeling device.

Please refer to FIG. 9, which is a schematic view of the second structure of the non-linear system modeling device of the motor provided by the embodiment of the present invention. The non-linear system modeling device 500 of the motor can include: Obtain module 501, excitation module 502, process module 503, splicing module 504.

Obtain module 501, which is used to obtain chirp signals of multiple different frequency bands in the working frequency of the motor. Among the multiple different frequency bands, a start frequency of one frequency band is the start frequency of the working frequency of the motor. And there is a cut-off frequency of a frequency band that is the cut-off frequency of the working frequency of the motor. Multiple different frequency bands can form the working frequency of the motor.

The excitation module 502 is configured to use the chirp signal of each frequency band to excite the motor, and obtain the output corresponding to each frequency band.

The processing module 503 is configured to obtain the higher harmonic frequency response of each frequency band according to the output corresponding to each frequency band and the chirp signal of each frequency band. In this way, higher harmonic frequency responses of multiple frequency bands are obtained.

The splicing module 504 is used to splice the higher harmonic frequency response of multiple frequency bands in the frequency domain to obtain the higher harmonic frequency response of the working frequency of the motor. The higher harmonic frequency response of the working frequency of the motor is a nonlinear system model of the motor.

Figure 10:
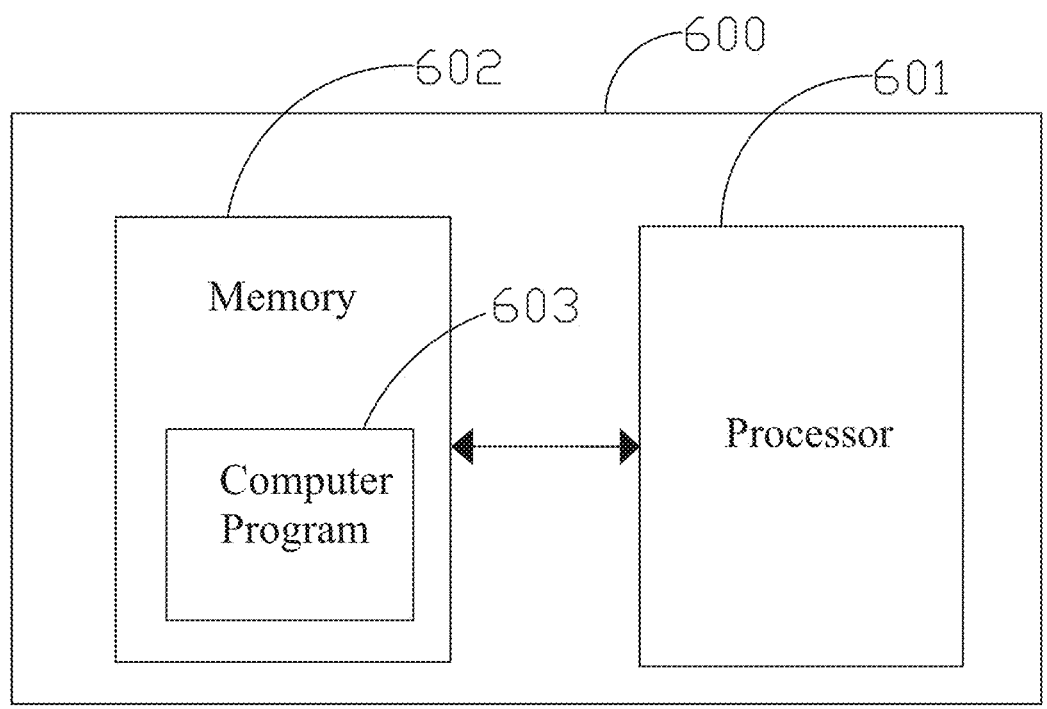
FIG. 10 is a schematic view of an electronic equipment.

FIG. 10 is a schematic view of electronic equipment provided by the embodiment of the present invention. As shown in FIG. 10, the electronic equipment 600 of this embodiment includes: A processor 601, a memory 602, and a computer program 603 that is stored in the memory 602 and can run on the processor 601. For example, the nonlinear system modeling program of motor. When the processor 601 executes the computer program 603, the steps in the non-linear system modeling method of each motor embodiment are realized. For example, steps 101 to 104 shown in FIG. 1. Alternatively, when the processor 601 executes the computer program 603, the functions of the modules in the aforementioned device embodiment are realized, for example, the functions of the modules 401 to 402 shown in FIG. 8.

Exemplarily, the computer program 603 may be divided into one or more modules/units. The one or more modules/units are stored in the memory 602 and executed by the processor 601 to complete the present invention. The one or more modules/units may be a series of computer program instruction segments capable of completing specific functions. This instruction segment is used to describe the execution process of the computer program 603 in the electronic equipment 600. For example, the computer program 603 may be divided into an obtaining module, a first excitation module, a second excitation module, and a splicing module (a unit module in a virtual device). The specific functions of each module are as follows:

an obtaining module, which is used to obtain the chirp signal of the first frequency band in the working frequency of the motor and the chirp signal of the second frequency band in the working frequency of the motor. a start frequency of the first frequency band is the start frequency of the working frequency of the motor. The cut-off frequency of the second frequency band is the cut-off frequency of the working frequency of the motor, and the first frequency band and the second frequency band partially overlap.

a first excitation module, which is used to excite the motor with the chirp signal of the first frequency band to obtain the first output. And according to the chirp signal of the first output and the first frequency band. In this way, the higher harmonic frequency response of the first frequency band is obtained.

A second excitation module, which is used to excite the motor with the chirp signal of the second frequency band to obtain the second output. And according to the second output and the chirp signal of the second frequency band, the higher harmonic frequency response of the second frequency band is obtained.

a splicing module, which is used to splice the higher harmonic frequency response of the first frequency band and the higher harmonic frequency response of the second frequency band in the frequency domain to obtain the higher harmonic frequency response of the working frequency of the motor. The higher harmonic frequency response of the working frequency of the motor is a nonlinear system model of the motor.

The electronic equipment 600 can be a computing device such as a desktop computer, a notebook, a palmtop computer, and a cloud server. The electronic equipment 600 may include, but is not limited to, a processor 601 and a memory 602. Those skilled in the art can understand that FIG. 10 is only an example of the electronic equipment 600, and does not constitute a limitation on the electronic equipment 600. It may include more or fewer parts than shown, or combine some parts, or different parts. For example, electronic equipment 600 may also include input and output devices, network access devices, buses, and so on.

The processor 601 may be a central processing unit (Central Processing Unit, CPU), other general-purpose processors, digital signal processors (Digital Signal Processor, DSP), application specific integrated circuits (Application Specific Integrated Circuit, ASIC), ready-made Field-Programmable Gate Array (FPGA) or other programmable logic devices, discrete gates or transistor logic devices, discrete hardware components, etc. The general-purpose processor may be a microprocessor or the processor may also be any conventional processor or the like.

The memory 602 may be an internal storage unit of the electronic equipment 600, such as a hard disk or a memory of the electronic equipment 600. The memory 602 may also be an external storage device of the electronic equipment 600, such as a plug-in hard disk, a smart memory card (Smart Media Card, SMC), or a secure digital card (Secure Digital, SD) equipped on the electronic equipment 600, Flash Card, etc. Further, the memory 602 may also include both an internal storage unit of the electronic equipment 600 and an external storage device. The memory 602 is used to store the computer program and other programs and data required by the electronic equipment 600. The memory 602 can also be used to temporarily store data that has been output or will be output.

Those skilled in the art can clearly understand that, for convenience and conciseness of description, only the division of the above-mentioned functional units and modules is used as an example for illustration. In practical applications, the above functions can be allocated by different functional units and modules as required. That is, the internal structure of the electronic equipment is divided into different functional units or modules to complete all or part of the functions described above. The functional units and modules in the embodiment can be integrated into one processing unit. Each unit may exist alone physically, or two or more units may be integrated into one unit. The above-mentioned integrated unit can be implemented in the form of hardware or software functional unit. In addition, the specific names of each functional unit and module are only for the convenience of distinguishing each other, and are not used to limit the protection scope of the present invention. For the specific working process of the unit and module in the above system, please refer to the corresponding process in the aforementioned method embodiment, which will not be repeated here.

In the above-mentioned embodiment, the description of each embodiment has its own emphasis. For the part that is not detailed or recorded in an embodiment, please refer to the relevant description of other embodiments.

A person of ordinary skill in the art may be aware that the units and algorithm steps of the examples described in combination with the embodiment disclosed herein can be implemented by electronic hardware or a combination of computer software and electronic hardware. Whether these functions are executed by hardware or software depends on the specific application and design constraint conditions of the technical solution. Professionals and technicians can use different methods for each specific application to implement the described functions, but such implementation should not be considered as going beyond the scope of the present invention.

In the embodiment provided by the present invention, it should be understood that the disclosed device/electronic equipment and method can be implemented in other ways. For example, the device/electronic equipment described above is only illustrative. For example, the division of modules or units is only a logical function division. In actual implementation, there may be other division methods, for example, multiple units or components may be combined or integrated into another system, or some features may be ignored or not implemented. In addition, the displayed or discussed mutual coupling or direct coupling or communication connection may be through some interfaces. The indirect coupling or communication connection of the device or unit can be electrical, mechanical or other forms.

The units described as separate components may or may not be physically separated, and the components displayed as units may or may not be physical units, that is, they may be located in one place, or they may be distributed on multiple network units. Some or all of the units can be selected according to actual needs to achieve the purpose of this embodiment solution.

In addition, each functional unit in each embodiment of the present invention can be integrated into one processing unit. Each unit may exist alone physically, or two or more units may be integrated into one unit. The above-mentioned integrated unit can be implemented in the form of hardware or software functional unit.

If the integrated module/unit is implemented in the form of a software functional unit and sold or used as an independent product, it can be stored in a computer readable storage medium. Based on this understanding, the present invention realizes all or part of the processes in the above-mentioned embodiment method, which can also be completed by instructing relevant hardware through a computer program. The computer program can be stored in a computer-readable storage medium, and when the computer program is executed by a processor, it can implement the steps of the embodiment in each method described above. Wherein, the computer program includes computer program code, and the computer program code may be in the form of source code, object code, executable file, or some intermediate forms. The computer-readable medium may include: Any entity or device capable of carrying the computer program code, recording medium, U disk, mobile hard disk, magnetic disk, optical disk, computer memory, read-only memory (Read-Only Memory, ROM), random access memory (Random Access Memory, RAM), electric carrier signal, telecommunications signal, and software distribution medium. It should be noted that the content accommodated in the computer-readable medium can be appropriately increased or decreased in accordance with the requirements of the legislation and patent practices in the jurisdiction. For example, in some jurisdictions, according to legislation and patent practices, computer-readable media do not include electrical carrier signals and telecommunication signals.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A nonlinear system modeling method for controlling a motor, including steps of:
    obtaining a chirp signal of a first frequency band in a working frequency s of the motor, and a chirp signal of a second frequency band in the working frequency of the motor;
    wherein a start frequency of the first frequency band is a start frequency of the working frequency of the motor, a cut-off frequency of the second frequency band is a cut-off frequency of the working frequency of the motor, and the first frequency band partially overlaps the second frequency band;
wherein a chirp signal comprises a variable a(t) which is a function of frequency that changes with time (t); wherein the value of a(t) is set at a low constant value at certain frequency points where the motor is easy to shell;
    exciting the motor by using the chirp signal of the first frequency band to obtaining a first output;
    obtaining a higher harmonic frequency response of the first frequency band according to the first output and the chirp signal of the first frequency is band;
    exciting the motor by using the chirp signal of the second frequency band to obtain a second output;
    obtaining a higher harmonic frequency response of the second frequency band according to the second output and the chirp signal of the second frequency band;
    determining a higher harmonic frequency response of the working frequency of the motor by splicing the higher harmonic frequency response of the first frequency band and the higher harmonic frequency response of the second frequency band in the frequency domain to ensure an accuracy of a nonlinear system model of the motor;

wherein the higher harmonic frequency response of the working frequency of the motor is the nonlinear system model of the motor which is used for controlling.

2. The nonlinear system modeling method for a motor as described in claim 1 further including steps of:

obtaining a first preset frequency and a second preset frequency greater than the first preset frequency;

determining a frequency band of the working frequency of the motor that is less than or equal to the second preset frequency as the first frequency band;

determining a frequency band of the working frequency of the motor that is greater than or equal to the first preset frequency as the second frequency band;

wherein the step of obtaining the higher harmonic frequency response of the working frequency of the motor by splicing the higher harmonic frequency response of the first frequency band and the higher harmonic frequency response of the second frequency band in the frequency domain, includes steps of:

obtaining a third preset frequency between the first preset frequency and the second preset frequency;

truncating a higher harmonic frequency response of the third frequency band from the higher harmonic frequency response of the first frequency band; wherein a start frequency of the third frequency band is the start frequency of the first frequency band; a cut-off frequency of the third frequency band is the third preset frequency; truncating a higher harmonic frequency response of a fourth frequency band from the higher harmonic frequency response of the second frequency band; wherein a start frequency of the fourth frequency band is the third preset frequency; a cut-off frequency of the fourth frequency band is the cut-off frequency of the second frequency band;

obtaining a higher harmonic frequency response of the working frequency of the motor by splicing the higher harmonic frequency response of the third frequency band and the higher harmonic frequency response of the fourth frequency band in the frequency domain.

3. The nonlinear system modeling method for a motor as described in claim 1 further including steps of:

obtain a fourth preset frequency;

determining a frequency band of the working frequency of the motor that is less than or equal to the fourth preset frequency as the first frequency band;

determining a frequency band greater than or equal to the fourth preset frequency in the working frequency of the motor as the second frequency band.

4. The nonlinear system modeling method for a motor as described in claim 1, wherein the step of obtaining the higher harmonic frequency response of the first frequency band in the first output and the chirp signal of the first frequency band includes steps of:

using Fourier transform on the first output to obtain the first frequency domain response;

according to the first frequency domain response, using an inverse signal frequency domain of the chirp signal of the first frequency band to analyze and calculate the first response function of the motor system;

using the first response function to obtain a first kernel function through conversion matrix conversion;

obtaining the higher harmonic frequency response of the first frequency band from the chirp signal of the first frequency band and the first kernel function; wherein the step of obtaining the higher harmonic frequency response of the second frequency band according to the second output and the chirp signal of the second frequency band includes steps of:

using Fourier transform on the second output to obtain the second frequency domain response;

according to the second frequency domain response, using an inverse signal frequency domain of the chirp signal of the second frequency band to analyze and calculate the second response function of the motor system;

using a second response function to obtain the second kernel function through conversion matrix conversion;

obtaining the higher harmonic frequency response of the second frequency band from the chirp signal of the second frequency band and the second kernel function.

5. The nonlinear system modeling method for a motor as described in claim 1, wherein: the chirp signal is calculated by the following formula:

$$x(t) = a(t)\sin\left[2\pi f_1 L \, \exp\left(\frac{t}{L}\right)\right]$$

$$L = \frac{T}{\ln\left(\frac{f_2}{f_1}\right)}$$

where, $f_1$ is the start frequency of the chirp signal, a(t) is the amplitude, and t is the time, that is, a(t) is the function of the frequency that changes with time, T is the length of the chirp signal, and $f_2$ is the chirp signal cut-off frequency.

6. A nonlinear system modeling method for controlling a motor including steps of:

obtaining chirp signals of multiple different frequency bands in a working frequency of the motor;

wherein, among the multiple different frequency bands, a start frequency of one frequency band is a start frequency of the working frequency of the motor;

a cut-off frequency of a frequency band that is a cut-off frequency of the working frequency of the motor, and the multiple different frequency bands form the working frequency of the motor;

wherein a chirp signal comprises a variable a(t) which is a function of frequency that changes with time (t); wherein the value of a(t) is set at a low constant value at certain frequency points where the motor is easy to shell;

exciting the motor by the chirp signal of each frequency band, and obtaining an output corresponding to each frequency band;

obtaining a higher harmonic frequency response of each frequency band according to the output corresponding to each frequency band and the chirp signal of each frequency band to obtain higher harmonic frequency responses of multiple frequency bands;

determining a higher harmonic frequency response of the working frequency of the motor by splicing the higher harmonic frequency response of multiple frequency bands in the frequency domain to ensure an accuracy of a nonlinear system model of the motor;

wherein the higher harmonic frequency response of the working frequency of the motor is the nonlinear system model of the motor which is used for controlling.

7. A non-linear system modeling device of controlling a motor, including:
- an obtaining module for obtaining a chirp signal of a first frequency band in a working frequency of the motor and a chirp signal of a second frequency band in the working frequency of the motor; wherein a start frequency of the first frequency band is a start frequency of the working frequency of the motor; a cut-off frequency of the second frequency band is a cut-off frequency of the working frequency of the motor; the first frequency band partially overlaps the second frequency band; wherein a chirp signal comprises a variable a(t) which is a function of frequency that changes with time (t); wherein the value of a(t) is set at a low constant value at certain frequency points where the motor is easy to shell;
- a first excitation module to excite the motor with the chirp signal of the first frequency band for obtaining a first output and a higher harmonic frequency response of the first frequency band according to the first output and the chirp signal of the first frequency band;
- a second excitation module to excite the motor with the chirp signal of the second frequency band for obtaining a second output and a higher harmonic frequency response of the second frequency band according to the second output and the chirp signal of the second frequency band;
- a splicing module to splice the higher harmonic frequency response of the first frequency band and the higher harmonic frequency response of the second frequency band in the frequency domain for determining a higher harmonic frequency response of the working frequency of the motor to ensure an accuracy of a nonlinear system model of the motor; and wherein the higher harmonic frequency response of the working frequency of the motor is the nonlinear system model of the motor which is used for controlling.

* * * * *